(12) United States Patent
Lin et al.

(10) Patent No.: US 9,356,768 B2
(45) Date of Patent: May 31, 2016

(54) PHASE DETECTING CIRCUIT FOR INTERCHAIN LOCAL OSCILLATOR (LO) DIVIDER PHASE ALIGNMENT

(71) Applicant: QUALCOMM Incorporated, San Diego, CA (US)

(72) Inventors: David Ta-Hsiang Lin, San Diego, CA (US); Yongwang Ding, Dublin, CA (US); Young Gon Kim, San Jose, CA (US); Thinh Cat Nguyen, San Jose, CA (US); Jeongsik Yang, San Jose, CA (US); Sang-Oh Lee, Cupertino, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 14/495,183

(22) Filed: Sep. 24, 2014

(65) Prior Publication Data

US 2016/0087783 A1     Mar. 24, 2016

(51) Int. Cl.
    *H04L 7/00*        (2006.01)
    *H03K 5/22*        (2006.01)
               (Continued)

(52) U.S. Cl.
    CPC .............. *H04L 7/0041* (2013.01); *H03K 5/22* (2013.01); *H03M 1/34* (2013.01); *H04B 1/40* (2013.01); *H03K 2005/00286* (2013.01)

(58) Field of Classification Search
CPC ....... H03D 3/007; H03D 3/008; H03D 3/009; H03D 3/02; H03D 13/00; H03D 13/003; H03D 13/007; H03D 2200/0017; H03D 2200/0019; H03D 2200/002; H03D 2200/0029; H03D 2200/0035; H03D 2200/0049; H03D 2200/005; H03D 2200/0054; H03D 2200/0066; H03D 2200/0068; H03D 2200/007; H03D 2200/0072; H03D 2200/0076; H03K 5/22; H03K 5/24; H03K 2005/00267; H03K 2005/00273; H03K 2005/00286; H03L 7/081; H03L 7/085; H03L 7/087; H03L 7/091; H03L 7/095; H03L 2207/12; H03M 1/34; H04B 1/0007; H04B 1/001; H04B 1/0014; H04B 1/0017; H04B 1/0028; H04B 1/0032; H04B 1/0035; H04B 1/0039; H04B 1/0042; H04B 1/38; H04B 1/40; H04L 7/00; H04L 7/0008; H04L 7/0041
USPC ......... 375/219, 220, 222, 226, 257, 259–261, 375/268, 269, 275, 279–281, 283, 354, 356, 375/362, 364, 375; 327/3, 7, 8, 12, 40–43, 327/63–65, 69, 71, 72, 74, 75, 77, 90, 93, 327/144, 145, 231–236; 331/18, 25; 340/12.11, 12.13, 12.51
See application file for complete search history.

(56) References Cited

U.S. PATENT DOCUMENTS 5,799,037 A * 8/1998 Strolle ....................... H03J 7/04
                                                  348/E5.108
5,808,498 A * 9/1998 Donnelly ............... H03H 11/18
                                                      327/238

(Continued)

*Primary Examiner* — Young T Tse
(74) *Attorney, Agent, or Firm* — Patterson & Sheridan, LLP

(57) ABSTRACT

Certain aspects of the present invention provide methods and apparatus for detecting phase shift between signals, such as local oscillating signals in adjacent transceiver paths. One example circuit for phase detection generally includes a mixer configured to mix a first input signal having a first frequency with a second input signal having a second frequency to produce an output signal having frequency components at the sum of and the difference between the first and second frequencies; a filter connected with the mixer and configured to remove one of the frequency components at the sum of the first and second frequencies, thereby leaving a DC component; and an analog-to-digital converter (ADC) (e.g., a comparator) connected with the filter and configured to determine whether the first input signal is in-phase or out-of-phase with the second input signal based on a comparison between the DC component and a reference signal.

30 Claims, 8 Drawing Sheets

(51) Int. Cl.
　　*H03M 1/34*　　　(2006.01)
　　*H04B 1/40*　　　(2015.01)
　　*H03K 5/00*　　　(2006.01)

(56) References Cited

U.S. PATENT DOCUMENTS

| | | | |
|---|---|---|---|
| 5,919,134 A * | 7/1999 | Diab | A61B 5/14551 600/323 |
| 7,200,188 B2 | 4/2007 | Fague et al. | |
| 7,499,513 B1 | 3/2009 | Tetzlaff et al. | |
| 7,680,227 B2 | 3/2010 | Kavadias et al. | |
| 7,933,361 B2 | 4/2011 | Huang et al. | |
| 7,978,802 B1 | 7/2011 | Raha et al. | |
| 8,204,154 B2 | 6/2012 | Min et al. | |
| 8,537,950 B2 | 9/2013 | Han et al. | |
| 8,791,740 B2 | 7/2014 | Qiao et al. | |
| 8,854,098 B2 | 10/2014 | Yang et al. | |
| 2004/0229584 A1 * | 11/2004 | Fischer | H04B 1/30 455/209 |
| 2005/0143028 A1 * | 6/2005 | Zheng | H03D 3/008 455/127.1 |
| 2005/0144650 A1 * | 6/2005 | Tu | H03D 3/007 725/131 |
| 2006/0001494 A1 | 1/2006 | Garlepp et al. | |
| 2006/0023624 A1 * | 2/2006 | Han | H04L 1/0003 370/204 |
| 2008/0284525 A1 * | 11/2008 | Williams | H03L 7/087 331/11 |
| 2009/0131006 A1 * | 5/2009 | Wu | H03D 7/1441 455/257 |
| 2009/0264789 A1 * | 10/2009 | Molnar | A61N 1/36135 600/544 |
| 2010/0040175 A1 | 2/2010 | Muraguchi et al. | |

* cited by examiner

PHASE DETECTING CIRCUIT FOR INTERCHAIN LOCAL OSCILLATOR (LO) DIVIDER PHASE ALIGNMENT

TECHNICAL FIELD

Certain aspects of the present invention generally relate to radio frequency (RF) electronic circuits and, more particularly, to detecting phase shift between signals.

BACKGROUND

Wireless communication networks are widely deployed to provide various communication services such as telephony, video, data, messaging, broadcasts, and so on. Such networks, which are usually multiple access networks, support communications for multiple users by sharing the available network resources. For example, one network may be a wireless local area network (WLAN) in accordance with the Institute of Electrical and Electronics Engineers (IEEE) 802.11 standard (e.g., Wi-Fi) or a wireless personal area network (WPAN) in accordance with the IEEE 802.15 standard. Another example wireless network may be a 3G (the third generation of mobile phone standards and technology), 4G, or later generation system, which may provide network service via any one of various radio access technologies (RATs) including EVDO (Evolution-Data Optimized), 1xRTT (1 times Radio Transmission Technology, or simply 1x), W-CDMA (Wideband Code Division Multiple Access), UMTS-TDD (Universal Mobile Telecommunications System—Time Division Duplexing), HSPA (High Speed Packet Access), GPRS (General Packet Radio Service), or EDGE (Enhanced Data rates for Global Evolution). The 3G network is a wide area cellular telephone network that evolved to incorporate high-speed internet access and video telephony, in addition to voice calls. Furthermore, a 3G network may be more established and provide larger coverage areas than other network systems. Such multiple access networks may also include code division multiple access (CDMA) systems, time division multiple access (TDMA) systems, frequency division multiple access (FDMA) systems, orthogonal frequency division multiple access (OFDMA) systems, single-carrier FDMA (SC-FDMA) networks, $3^{rd}$ Generation Partnership Project (3GPP) Long Term Evolution (LTE) networks, and Long Term Evolution Advanced (LTE-A) networks.

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station.

Certain radio frequency front-ends (RFFEs) have multiple receiver (RX) paths, multiple transmitter (TX) paths, or multiple transceiver paths, also known as chains. Each of these paths in a multi-chain RFFE may have its own local oscillator (LO). The various LOs may be generated from a single voltage-controlled oscillator (VCO) using, for example, a divide-by-2 (Div2) frequency divider associated with each path. Although all of the frequency dividers may output the same frequency LO, each divider may arbitrarily start-up either in-phase (0°) or out-of-phase (180°) relative to another divider. In order to achieve particular capabilities or perform certain functions, such as beamforming, it may be desirable to operate the dividers in-phase.

Accordingly, what is needed are techniques and apparatus for detecting whether two high frequency input signals are in-phase or out-of-phase and adjusting at least one of the two signals if they are out-of-phase.

SUMMARY

Certain aspects of the present invention generally relate to detecting and adjusting phase shift between signals, such as local oscillating signals of adjacent receiver, transmitter, or transceiver paths frequency divided down from a voltage-controlled oscillator (VCO) signal. In this manner, all local oscillating signals may be adjusted to be in-phase.

In accordance with certain aspects of the present invention, a circuit for phase detection is described. The circuit generally includes a mixer configured to mix a first input signal having a first frequency with a second input signal having a second frequency to produce an output signal having frequency components at the sum of and the difference between the first frequency and the second frequency, wherein the first frequency is the same as the second frequency; a filter connected with the output signal produced by the mixer and configured to remove one of the frequency components at the sum of the first frequency and the second frequency, thereby leaving a direct current (DC) component; and an analog-to-digital converter (ADC) connected with the DC component from the filter and configured to determine whether the first input signal is in-phase or out-of-phase with the second input signal based on a comparison between the DC component and a reference signal.

According to certain aspects, the first, second, and output signals are differential signals. In this case, the filter may include a capacitor to shunt a first output signal and a second output signal of a differential pair for the output signal to generate a first DC component and a second DC component, respectively. For certain aspects, the ADC may be a comparator (e.g., a 1-bit ADC), and the comparator may be configured to compare the first output signal to the second output signal, where the second output signal is the reference signal. In this case, the comparator may output a logic HIGH to indicate that the first input signal is in-phase with the second input signal if the first DC component has a greater amplitude than the second DC component, and the comparator may output a logic LOW to indicate the first input signal is out-of-phase with the second input signal if the second DC component has a greater amplitude than the first DC component.

According to certain aspects, a first expected phase shift range corresponding to the first input signal being in-phase with the second input signal leads to an amplitude of the DC component being above a first threshold for the ADC. A second expected phase shift range corresponding to the first input signal being out-of-phase with the second input signal may lead to the amplitude of the DC component being below a second threshold for the ADC.

For certain aspects, the mixer includes a Gilbert cell.

For certain aspects, the ADC is a clocked regenerative comparator.

According to certain aspects, the ADC is a multi-bit ADC configured to provide information in addition to a determination whether the first input signal is in-phase or out-of-phase with the second input signal. For certain aspects, the information indicates a degree to which the first and second input signals are phase shifted.

In accordance with certain aspects of the present invention, a circuit for wireless communications is described. The circuit generally includes a first transceiver path having a first local oscillating signal with a first frequency; a second transceiver path having a second local oscillating signal with a second frequency, wherein the first frequency is the same as the second frequency; and a first phase detector connected with the first transceiver path and the second transceiver path. The first phase detector typically includes a first mixer configured to mix the first local oscillating signal with the second local oscillating signal to produce a first output signal having frequency components at the sum of and the difference between the first frequency and the second frequency; a first filter connected with the first mixer and configured to remove one of the frequency components at the sum of the first frequency and the second frequency, thereby leaving a first direct current (DC) component; and a first analog-to-digital converter (ADC) connected with the first filter and configured to determine whether the first local oscillating signal is in-phase or out-of-phase with the second local oscillating signal based on a comparison between the first DC component and a first reference signal.

According to certain aspects, the first transceiver path includes a first frequency divider configured to divide a frequency of a voltage-controlled oscillator (VCO) signal to produce the first local oscillating signal. The second transceiver path may include a second frequency divider configured to divide the frequency of the VCO signal to produce the second local oscillating signal. For certain aspects, the circuit further includes a repeater configured to regenerate the VCO signal. In this case, the second frequency divider may be configured to produce the second local oscillating signal from the regenerated VCO signal.

According to certain aspects, the circuit further includes a phase shifter configured to phase shift the first local oscillating signal or the second local oscillating signal if the first ADC determines that the first local oscillating signal is out-of-phase with the second local oscillating signal.

According to certain aspects, the circuit further includes a third transceiver path having a third local oscillating signal with a third frequency, wherein the first frequency is the same as the third frequency, and a second phase detector connected with the second transceiver path and the third transceiver path. The second phase detector may include a second mixer configured to mix the second local oscillating signal with the third local oscillating signal to produce a second output signal having frequency components at the sum of and the difference between the second frequency and the third frequency; a second filter configured to receive the second output signal produced by the second mixer and to remove one of the frequency components at the sum of the second frequency and the third frequency, thereby leaving a second DC component; and a second ADC connected with the second filter and configured to receive the second DC component from the second filter and to determine whether the second local oscillating signal is in-phase or out-of-phase with the third local oscillating signal based on a comparison between the second DC component and a second reference signal. For certain aspects, the third transceiver path includes a third frequency divider configured to divide the frequency of the VCO signal to produce the third local oscillating signal.

According to certain aspects, the first local oscillating signal, the second local oscillating signal, and the first output signal are differential signals. In this case, the first filter may include a capacitor configured to shunt signals of a differential pair for the first output signal to generate a second DC component and a third DC component, respectively. For certain aspects, the first ADC is a comparator, and the comparator may be configured to compare the signals of the differential pair for the first output signal. The comparator may output a logic HIGH to indicate that the first local oscillating signal is in-phase with the second local oscillating signal if the second DC component has a greater amplitude than the third DC component. Alternatively, the comparator may output a logic LOW to indicate the first local oscillating signal is out-of-phase with the second local oscillating signal if the third DC component has a greater amplitude than the second DC component.

For certain aspects, the first mixer includes a Gilbert cell mixer.

For certain aspects, the first ADC is a clocked regenerative comparator.

According to certain aspects, the ADC is a multi-bit ADC configured to provide information in addition to a determination whether the first local oscillating signal is in-phase or out-of-phase with the second local oscillating signal. For certain aspects, the information indicates a degree to which the first and second local oscillating signals are phase shifted.

In accordance with certain aspects of the present invention, a method for detecting phase shift between signals is described. The method generally includes mixing a first input signal having a first frequency with a second input signal having a second frequency to produce an output signal having frequency components at the sum of and the difference between the first frequency and the second frequency, wherein the first frequency is the same as the second frequency; filtering the output signal to remove one of the frequency components at the sum of the first frequency and the second frequency, thereby leaving a DC component; comparing the DC component to a reference signal; and determining whether the first input signal is in-phase or out-of-phase with the second input signal based on the comparison.

In accordance with certain aspects of the present invention, an apparatus for detecting phase shift between signals is described. The apparatus generally includes means for mixing a first input signal having a first frequency with a second input signal having a second frequency to produce an output signal having frequency components at the sum of and the difference between the first frequency and the second frequency, wherein the first frequency is the same as the second frequency; means for filtering the output signal to remove one of the frequency components at the sum of the first frequency and the second frequency, thereby leaving a DC component; means for comparing the DC component to a reference signal; and means for determining whether the first input signal is in-phase or out-of-phase with the second input signal based on the comparison.

BRIEF DESCRIPTION OF THE DRAWINGS

So that the manner in which the above-recited features of the present invention can be understood in detail, a more particular description, briefly summarized above, may be had by reference to aspects, some of which are illustrated in the appended drawings. It is to be noted, however, that the appended drawings illustrate only certain typical aspects of the present invention and are therefore not to be considered limiting of its scope, for the description may admit to other equally effective aspects.

DETAILED DESCRIPTION

Various aspects of the present invention are described below. It should be apparent that the teachings herein may be embodied in a wide variety of forms and that any specific structure, function, or both being disclosed herein is merely representative. Based on the teachings herein, one skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein. Furthermore, an aspect may comprise at least one element of a claim.

The word "exemplary" is used herein to mean "serving as an example, instance, or illustration." Any aspect described herein as "exemplary" is not necessarily to be construed as preferred or advantageous over other aspects.

The techniques described herein may be used in combination with various wireless technologies such as Code Division Multiple Access (CDMA), Orthogonal Frequency Division Multiplexing (OFDM), Time Division Multiple Access (TDMA), Spatial Division Multiple Access (SDMA), Single Carrier Frequency Division Multiple Access (SC-FDMA), Time Division Synchronous Code Division Multiple Access (TD-SCDMA), and the like. Multiple user terminals can concurrently transmit/receive data via different (1) orthogonal code channels for CDMA, (2) time slots for TDMA, or (3) sub-bands for OFDM. A CDMA system may implement IS-2000, IS-95, IS-856, Wideband-CDMA (W-CDMA), or some other standards. An OFDM system may implement Institute of Electrical and Electronics Engineers (IEEE) 802.11 (Wireless Local Area Network (WLAN)), IEEE 802.16 (Worldwide Interoperability for Microwave Access (WiMAX)), Long Term Evolution (LTE) (e.g., in TDD and/or FDD modes), or some other standards. A TDMA system may implement Global System for Mobile Communications (GSM) or some other standards. These various standards are known in the art. The techniques described herein may also be implemented in any of various other suitable wireless systems using radio frequency (RF) technology, including Global Navigation Satellite System (GNSS), Bluetooth, IEEE 802.15 (Wireless Personal Area Network (WPAN)), Near Field Communication (NFC), Small Cell, Frequency Modulation (FM), and the like.

An Example Wireless System

Figure 1:
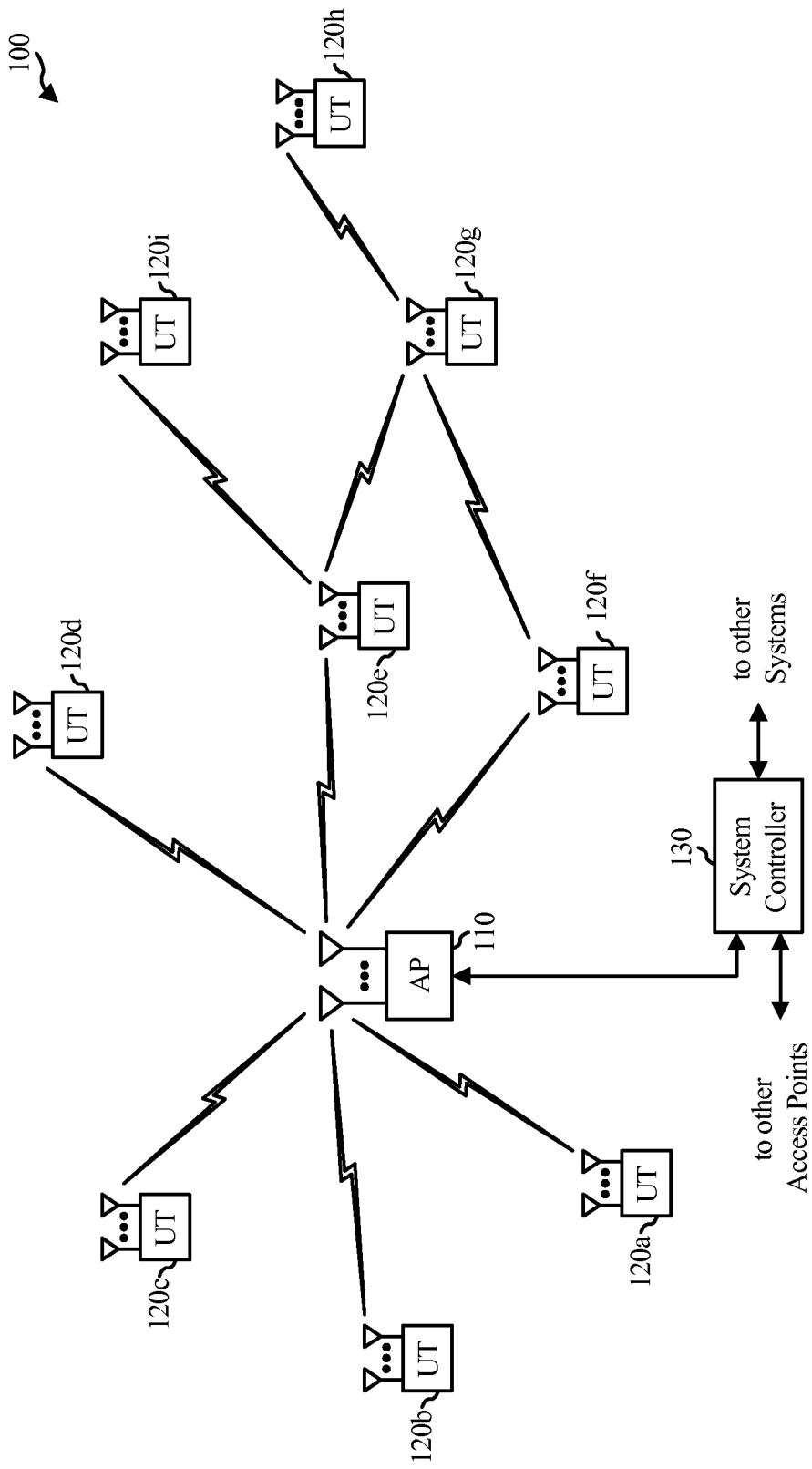
FIG. 1 illustrates an example wireless communications network in accordance with various aspects of the present invention.

FIG. 1 illustrates a wireless communications system 100 with access points and user terminals. For simplicity, only one access point 110 is shown in FIG. 1. An access point (AP) is generally a fixed station that communicates with the user terminals and may also be referred to as a base station (BS), an evolved Node B (eNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

System 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless system 100 may be a time division duplex (TDD) system or a frequency division duplex (FDD) system. For a TDD system, the downlink and uplink may share the same frequency band. For an FDD system, the downlink and uplink use different frequency bands. System 100 may also utilize a single carrier or multiple carriers for transmission. Each user terminal may be equipped with a single antenna (e.g., in order to keep costs down) or multiple antennas (e.g., where the additional cost can be supported).

Figure 2:
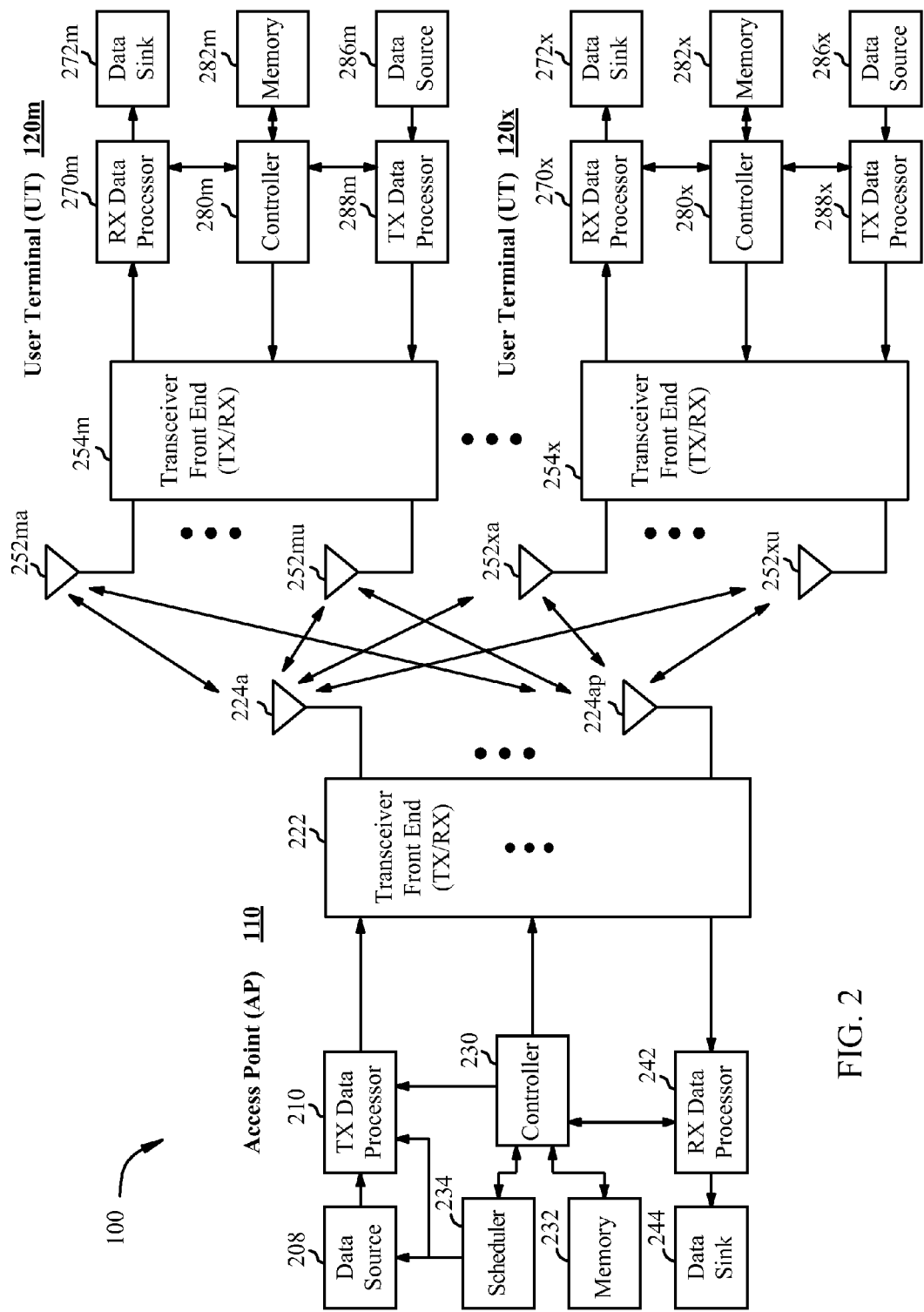
FIG. 2 is a block diagram of an example access point (AP) and user terminals in accordance with various aspects of the present invention.

FIG. 2 shows a block diagram of access point 110 and two user terminals 120m and 120x in wireless system 100. Access point 110 is equipped with $N_{ap}$ antennas 224a through 224ap. User terminal 120m is equipped with $N_{ut,m}$ antennas 252ma through 252mu, and user terminal 120x is equipped with $N_{ut,x}$ antennas 252xa through 252xu. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{ap}$ user terminals are selected for simultaneous transmission on the uplink, $N_{dn}$ user terminals are selected for simultaneous transmission on the downlink, $N_{up}$ may or may not be equal to $N_{dn}$, and $N_{up}$ and $N_{dn}$ may be static values or can change for each scheduling interval. Beam-steering or some other spatial processing technique may be used at the access point and user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver front-end (TX/RX) 254 (also known as a radio frequency front-end (RFFE)) receives and processes (e.g., converts to analog, amplifies, filters, and frequency upconverts) a respective symbol stream to generate an uplink signal. The transceiver front-end 254 may also route the uplink signal to one of the $N_{ut,m}$ antennas for transmit diversity via an RF switch, for example. The controller 280 may control the routing within the transceiver front-end 254.

A number $N_{up}$ of user terminals may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver front-end 222 may select signals received from one of the antennas 224 for processing. For certain aspects of the present invention, a combination of the signals received from multiple antennas 224 may be combined for enhanced receive diversity. The access point's transceiver front-end 222 also performs processing complementary to that performed by the user terminal's transceiver front-end 254 and provides a recovered uplink data symbol stream. The recovered uplink data symbol stream is an estimate of a data symbol stream $\{s_{up}\}$ transmitted by a user terminal An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal TX data processor 210 may provide a downlink data symbol streams for one of more of the $N_{dn}$ user terminals to be transmitted from one of the $N_{ap}$ antennas. The transceiver front-end 222 receives and processes (e.g., converts to analog, amplifies, filters, and frequency upconverts) the symbol stream to generate a downlink signal. The transceiver front-end 222 may also route the downlink signal to one or more of the $N_{ap}$ antennas 224 for transmit diversity via an RF switch, for example. The controller 230 may control the routing within the transceiver front-end 222.

At each user terminal 120, $N_{ut,m}$ antennas 252 receive the downlink signals from access point 110. For receive diversity at the user terminal 120, the transceiver front-end 254 may select signals received from one of the antennas 252 for processing. For certain aspects of the present invention, a combination of the signals received from multiple antennas 252 may be combined for enhanced receive diversity. The user terminal's transceiver front-end 254 also performs processing complementary to that performed by the access point's transceiver front-end 222 and provides a recovered downlink data symbol stream. An RX data processor 270 processes (e.g., demodulates, deinterleaves, and decodes) the recovered downlink data symbol stream to obtain decoded data for the user terminal.

Those skilled in the art will recognize the techniques described herein may be generally applied in systems utilizing any type of multiple access schemes, such as TDMA, SDMA, Orthogonal Frequency Division Multiple Access (OFDMA), CDMA, SC-FDMA, and combinations thereof.

Figure 3:
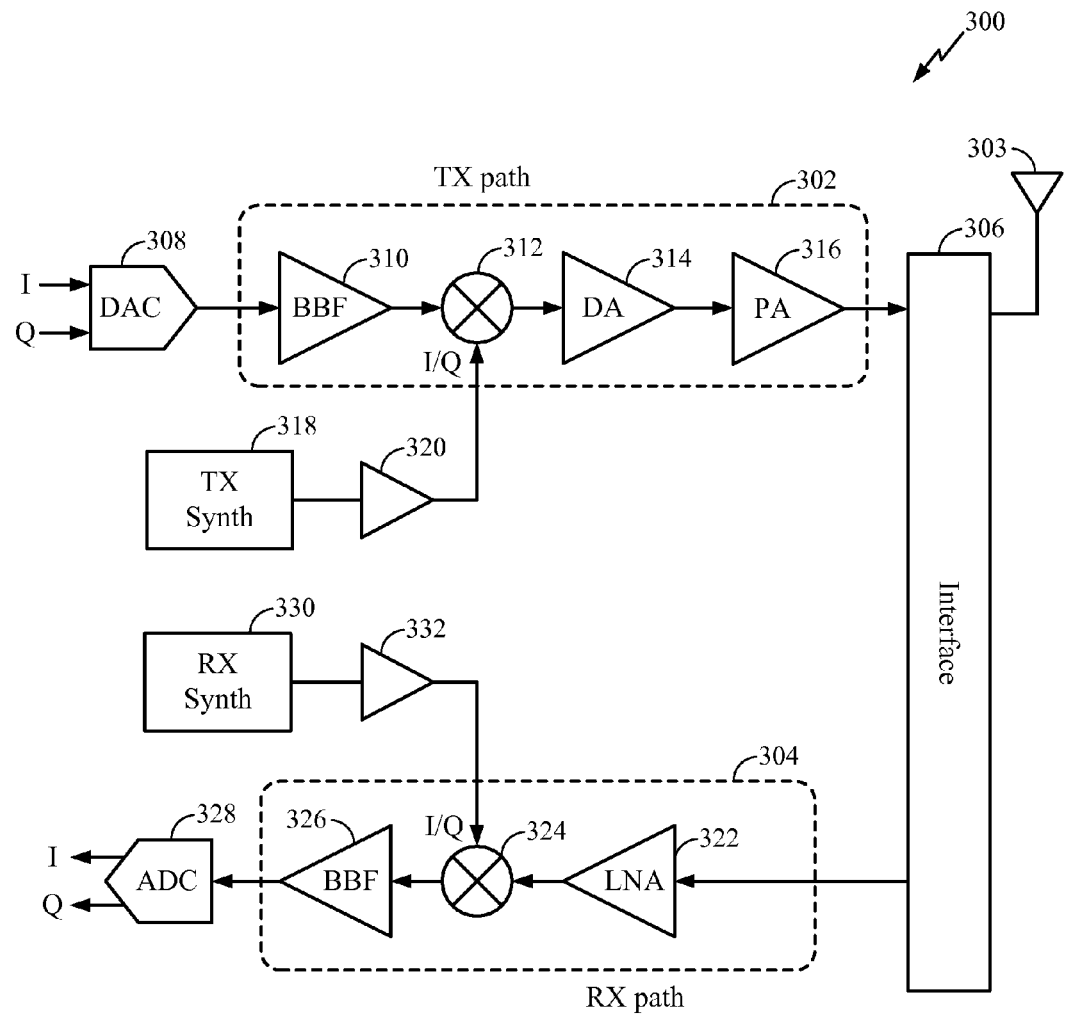
FIG. 3 is a block diagram of an example transceiver front-end.

FIG. 3 is a block diagram of an example transceiver front-end 300, such as transceiver front-ends 222, 254 in FIG. 2. The transceiver front-end 300 includes a transmit (TX) path 302 (also known as a transmit chain) for transmitting signals via one or more antennas and a receive (RX) path 304 (also known as a receive chain) for receiving signals via the antennas. When the TX path 302 and the RX path 304 share an antenna 303, the paths may be connected with the antenna via an interface 306, which may include any of various suitable RF devices, such as a duplexer, a switch, a diplexer, and the like.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, and a power amplifier 316. The BBF 310, the mixer 312, and the DA 314 may be included in a radio frequency integrated circuit (RFIC), while the PA 316 is often external to the RFIC. The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). This frequency conversion process produces the sum and difference frequencies of the LO frequency and the frequency of the signal of interest. The sum and difference frequencies are referred to as the beat frequencies. The beat frequencies are typically in the RF range, such that the signals output by the mixer 312 are typically RF signals, which are amplified by the DA 314 and by the PA 316 before transmission by the antenna 303.

The RX path 304 includes a low noise amplifier (LNA) 322, a mixer 324, and a baseband filter (BBF) 326. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing.

While it is desirable for the output of a LO to remain stable in frequency, tuning to different frequencies indicates using a variable-frequency oscillator, which involves compromises between stability and tunability. Contemporary systems employ frequency synthesizers with a voltage-controlled oscillator (VCO) to generate a stable, tunable LO with a particular tuning range. Thus, the transmit LO is typically produced by a TX frequency synthesizer 318, which may be buffered or amplified by amplifier 320 before being mixed with the baseband signals in the mixer 312. Similarly, the receive LO is typically produced by an RX frequency synthesizer 330, which may be buffered or amplified by amplifier 332 before being mixed with the RF signals in the mixer 324.

Example Phase Detecting Circuit

Figure 4:
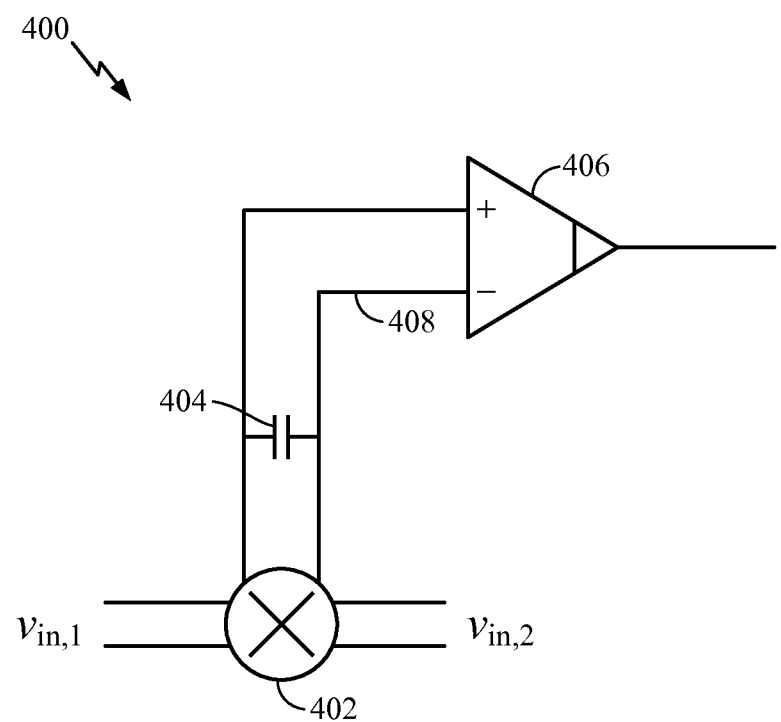
FIG. 4 illustrates an example phase detecting circuit for determining whether two input signals are in-phase or out-of-phase.

FIG. 4 illustrates an example phase detecting circuit 400. The phase detecting circuit 400 may be used to determine whether two input signals ($v_{in,1}$ and $v_{in,2}$) are in-phase or out-of-phase and output an indication thereof. The two input signals may be oscillating signals having the same frequency, which may be in the RF range. The phase detecting circuit 400 may include a mixer 402, a filtering capacitor 404, and a comparator 406 as shown in FIG. 4. For other aspects, the phase detecting circuit 400 may include a multi-bit analog-to-digital converter (ADC) (not shown) instead of or in addition to the comparator 406 (which can be considered as a single-bit ADC). For ease of description, the present disclosure refers to a comparator, but a person having ordinary skill in the art will understand that a multi-bit ADC may be used instead of a 1-bit ADC (i.e., the comparator).

The mixer 402 effectively multiplies the two input signals together, thereby producing an output signal having frequency components at the sum of and the difference of the two input signals' frequencies. If the two input signals have the same frequency, then the output signal has frequency components at DC and at twice the frequency of the input signal. For example, if the input signals are oscillating signals with a frequency of 2 GHz, then the output signal has frequency components at DC and at 4 GHz.

The mixer 402 may be implemented with a double-balanced mixer, such as a Gilbert cell. Using bipolar junction transistors (BJTs), the Gilbert cell may be realized using two cross-coupled emitter-coupled pairs of transistors in series with an emitter-coupled pair of transistors, as understood by a person skilled in the art of RF electronics. A functionally equivalent mixer circuit to the Gilbert cell may also be implemented using JFETs or MOSFETs, for example, instead of BJTs. When two unmodulated signals of identical frequency are applied to the two inputs of the Gilbert cell, this circuit behaves as a phase detector and produces an output whose DC component is proportional to the phase difference between the two input signals. The frequency component at twice the input frequency is filtered out using a low-pass filter, such as the filtering capacitor 404, thereby leaving only the DC component at the output of the filter.

The comparator 406 compares the DC component at the output of the filtering capacitor 404 to a reference signal 408. As used herein, the reference signal generally refers to the signal at the negative terminal of the comparator. If the amplitude of the DC component is above the amplitude of the reference signal (typically by a certain threshold for an expected phase shift range around 0°), then the comparator outputs a logic HIGH (a binary "1"), and the two input signals ($v_{in,1}$ and $v_{in,2}$) are determined to be in-phase. In contrast, if the amplitude of the DC component is below the amplitude of the reference signal (typically by a certain threshold for an expected phase shift range around 180°), then the comparator outputs a logic LOW (a binary "0"), and the two input signals ($v_{in,1}$ and $v_{in,2}$) are determined to be out-of-phase. For certain aspects, the inputs to the comparator 406 may be flipped to have the opposite binary logic. For certain aspects, the comparator 406 may be a clocked regenerative comparator.

As described above, the comparator 406 may be thought of as a 1-bit ADC. For certain aspects, the comparator is a circuit forming part of an ADC. For example, the ADC may be a multi-bit ADC configured to provide information in addition to a determination whether the first input signal is in-phase or out-of-phase with the second input signal. This additional information may indicate the degree to which the first and second input signals are phase shifted.

For certain aspects as illustrated in FIG. 4, the input signals and the output signal of the mixer 402 may be differential signals. In this case, the filtering capacitor 404 may shunt a first output signal and a second output signal of a differential pair for the output signal, thereby generating a first DC component and a second DC component, respectively. In this case, the second output signal is the reference signal 408, and the comparator 406 compares the first DC component to the second DC component. The first input signal ($v_{in,1}$) is determined to be in-phase with the second input signal ($v_{in,2}$) if the first DC component has a greater amplitude than the second DC component, while the first input signal ($v_{in,1}$) is determined to be out-of-phase with the second input signal ($v_{in,2}$) if the second DC component has a greater amplitude than the first DC component.

Example Interchain Lo Divider Phase Detection and Alignment

The phase detecting circuit 400 described above may be used to detect phase shifts between LO signals in two different radio frequency (RF) chains, for example. As described above, the RF chains may be RX chains, TX chains, or transceiver chains.

Figure 5A:
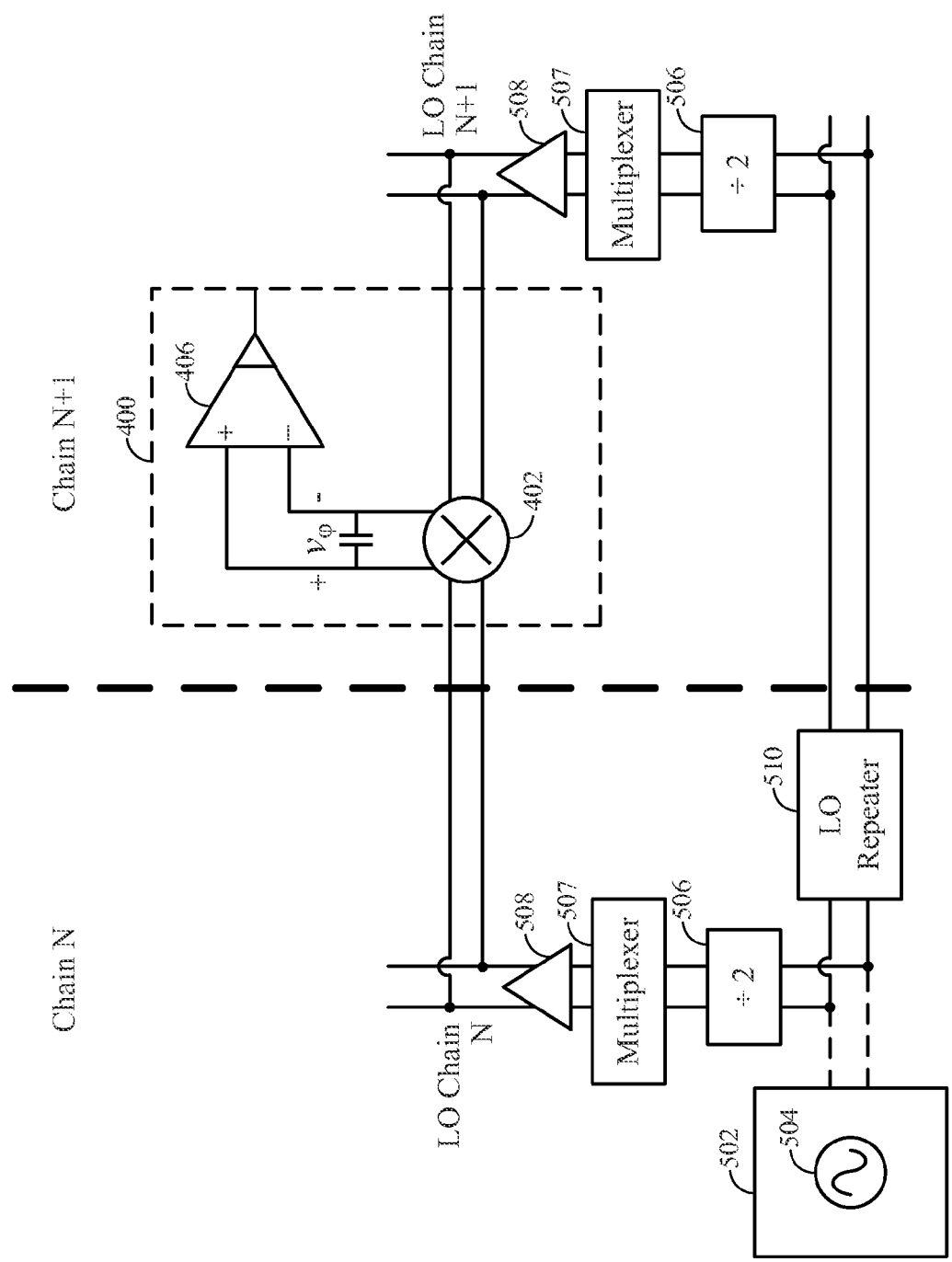
FIGS. 5A and 5B illustrate multiple example radio frequency (RF) chains, each generating a local oscillating signal, and the circuit of FIG. 4 for detecting phase shifts between local oscillating signals from two adjacent RF chains.

FIG. 5A is a block diagram illustrating two adjacent RF chains (labeled "Chain N" and "Chain N+1") in a multi-chain RFFE. A frequency synthesizer 502 (e.g., the TX frequency synthesizer 318 or the RX frequency synthesizer 330) may generate an oscillating signal (which may be referred to as a "VCO signal") using a VCO 504 and supporting circuitry. Each RF chain may generate its own LO using a divide-by-2 (Div2) frequency divider 506 and an amplifier 508 (e.g., as also shown in "Chain N+2" of FIG. 5B). Each divider 506 may arbitrarily start-up either in-phase (0°) or out-of-phase (180°) relative to a divider in another RF chain. The amplifier 508 may be used to amplify, buffer, or attenuate the frequency-divided output signal of the divider 506 to generate the LO for each chain.

A repeater 510 may be used to regenerate the VCO signal from one RF chain to the next. Unfortunately, the repeater may also introduce a phase shift between the signals input to the frequency dividers 506 in each RF chain.

The LO from one RF path (Chain N) may be input as the first input signal to the phase detecting circuit 400, and the LO from an adjacent RF path (Chain N+1) may be input as the second input signal to the phase detecting circuit. The phase detecting circuit 400 may be used to determine whether the LO in Chain N is in-phase or out-of-phase with the LO in Chain N+1 and output a binary indication based on this determination. Digital logic (e.g., XOR gates) may be used to determine which of the multiple LO signals should be phase adjusted. The digital logic may drive multiplexers 507, one in each RF chain, to select between normal (e.g., pass-through) and polarity-flipped signals in an effort to phase adjust the LO signals. The multiplexers 507 may be located between the frequency dividers 506 and the amplifiers 508.

Figure 5B:
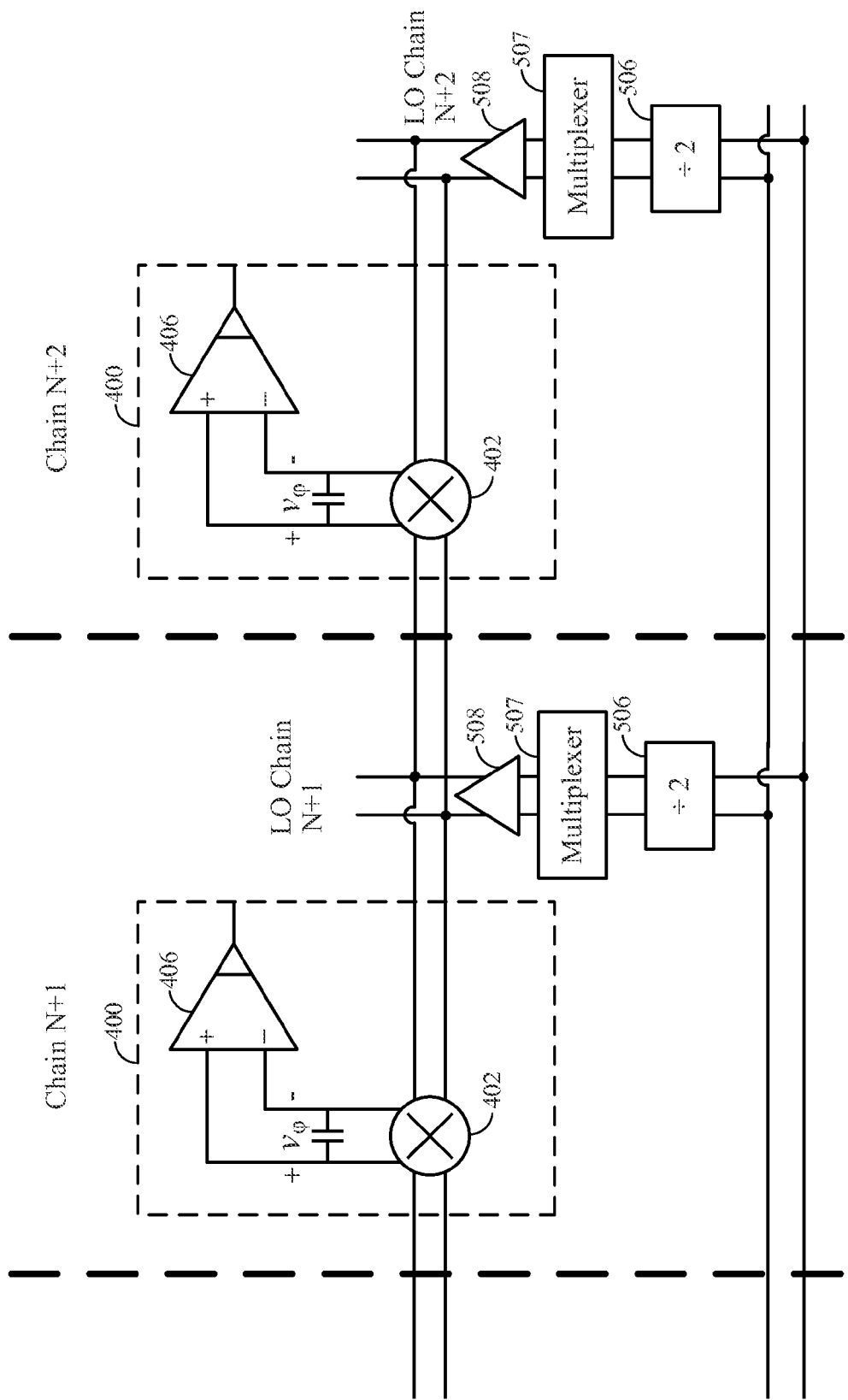

As an example, if an RFFE has four RF paths referred to as Chain 0, 1, 2, and 3 where Chain 1 is adjacent to Chain 0, Chain 2 is adjacent to Chain 1, and Chain 3 is adjacent to Chain 2, then Chains 1, 2, and 3 may each contain a phase detecting circuit 400. For certain aspects, Chain 0 may also include a phase detecting circuit 400 (e.g., for ease of repeating the same layout for all of these four RF paths), but this circuit may be deactivated. For example, FIG. 5B illustrates Chain N+2 adjacent to Chain N+1, which also includes a divide-by-2 (Div2) frequency divider 506, a multiplexer 507, an amplifier 508, and a phase detecting circuit 400.

Figure 6:
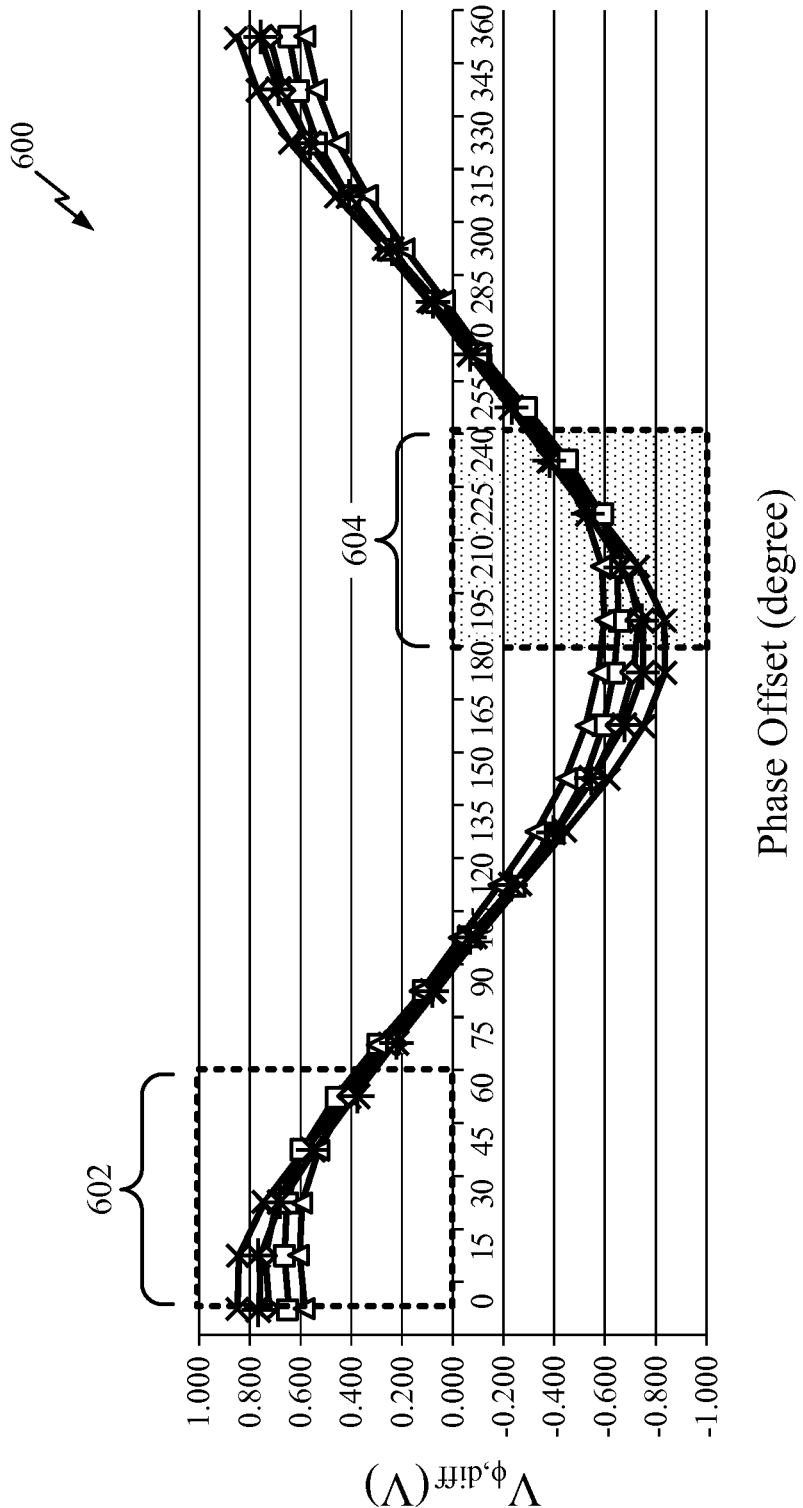
FIG. 6 is an example graph of a difference between two differential direct current (DC) component amplitudes across the filter in the phase detecting circuit of FIG. 4 versus phase offset.

FIG. 6 is an example graph 600 of the voltage difference ($V_{\phi,diff}$) between the differential signal pair output by the mixer 402 and filtered by the capacitor 404 versus phase offset in degrees for particular process, voltage and, temperature (PVT) variations. A first expected phase shift range 602 (e.g., between 0° and 67°) corresponding to the LO signal from Chain N being in-phase with the LO signal from Chain N+1 leads to the voltage difference ($V_{\phi,diff}$) being above a first threshold (e.g., 0.3 V). A second expected phase shift range 604 (e.g., between 180° and 247°) corresponding to the LO signal from Chain N being out-of-phase with the LO signal from Chain N+1 leads to the voltage difference ($V_{\phi,diff}$) being below a second threshold (e.g., −0.3 V).

Example Phase Detecting Operations

Figure 7:
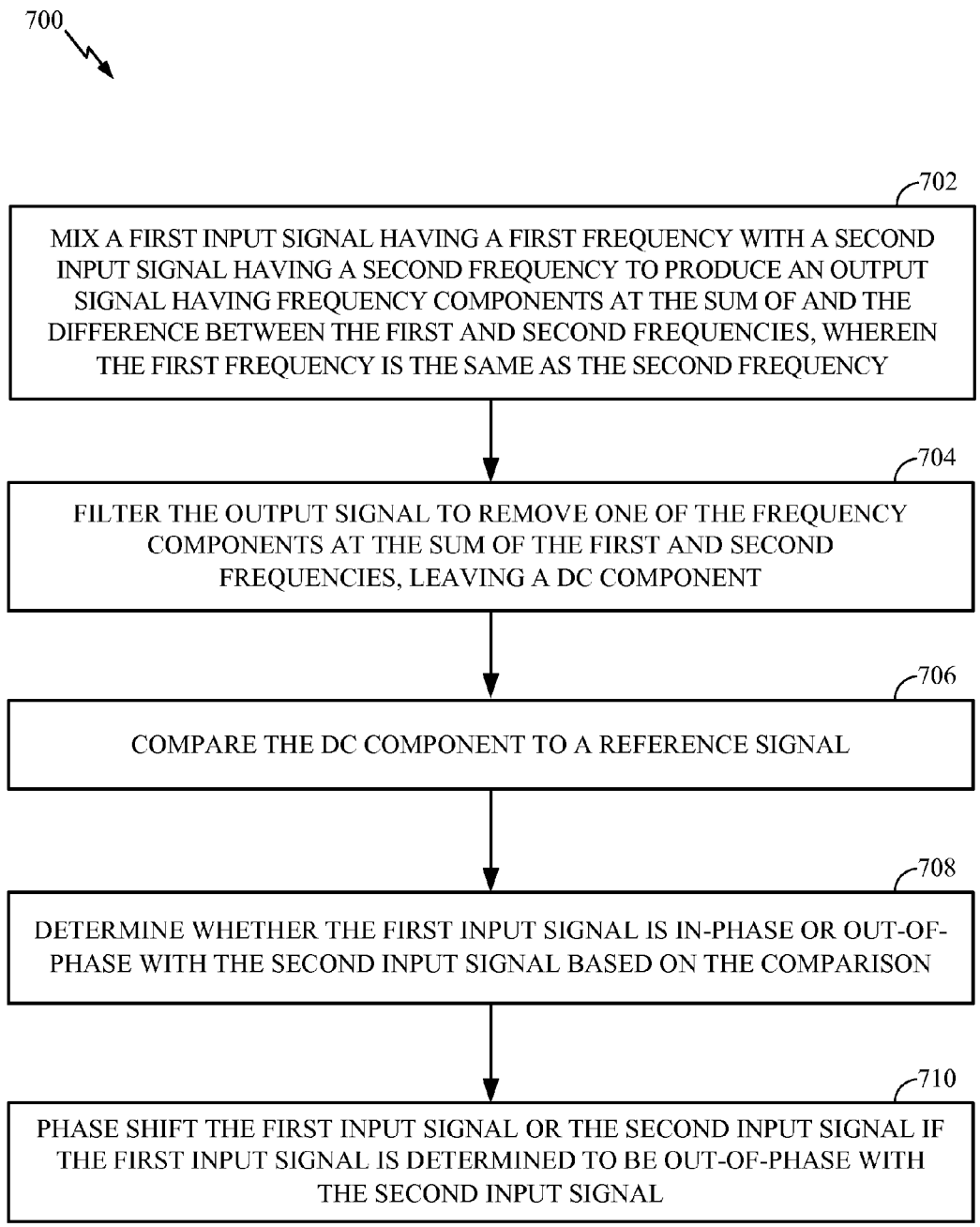
FIG. 7 is a flow diagram of example operations for detecting phase shift between signals.

FIG. 7 is a flow diagram of example operations 700 for detecting phase shift between signals. The operations 700 may be performed, at least in part, by a phase detector, such as the phase detecting circuit 400 depicted in FIGS. 4 and 5.

The operations 700 may begin, at block 702, with a mixer (e.g., the mixer 402) mixing a first input signal having a first frequency with a second input signal having a second frequency to produce an output signal having frequency components at the sum of and the difference between the first frequency and the second frequency. The first frequency is the same as the second frequency. For certain aspects, the mixing at block 702 involves using a Gilbert cell to mix the first input signal with the second input signal.

At block 704, a filter (e.g., the capacitor 404) may filter the output signal produced by the mixer to remove one of the frequency components at the sum of the first frequency and the second frequency. This filtering leaves a direct current (DC) component (i.e., the difference between the first and second frequencies, which are the same).

An ADC (e.g., the comparator 406, which is a 1-bit ADC) may compare the DC component to a reference signal at block 706. At block 708, digital logic or a processing unit, for example, may determine whether the first input signal is in-phase or out-of-phase with the second input signal based on the comparison at block 706.

According to certain aspects, the first, second, and output signals are differential signals. In this case, the filtering at block 704 may include using a capacitor to shunt a first output signal and a second output signal of a differential pair for the output signal to generate a first DC component and a second DC component, respectively. For certain aspects, the comparing at block 706 involves comparing the first output signal to the second output signal, where the second output signal is the reference signal. The first input signal may be determined to be in-phase with the second input signal if the first DC component has a greater amplitude than the second DC component (e.g., as shown in the graph 600 of FIG. 6). In the alternative, the first input signal may be determined to be out-of-phase with the second input signal if the second DC component has a greater amplitude than the first DC component.

According to certain aspects, a first expected phase shift range corresponding to the first input signal being in-phase with the second input signal may lead to an amplitude of the DC component being above a first threshold. Similarly, a second expected phase shift range corresponding to the first input signal being out-of-phase with the second input signal may lead to the amplitude of the DC component being below a second threshold.

According to certain aspects, the first input signal is a first local oscillating signal of a first transceiver path. The second input signal may be a second local oscillating signal of a second transceiver path adjacent to the first transceiver path. In this case, the operations 700 may further involve a first frequency dividing circuit (e.g., the frequency divider 506) frequency dividing a VCO signal to generate the first local oscillating signal. A repeater (e.g., the LO repeater 510) may regenerate the VCO signal to generate a repeated oscillating signal, and a second frequency dividing circuit may frequency divide the repeated oscillating signal to generate the second local oscillating signal.

According to certain aspects, the operations 700 may further involve a phase shifting circuit phase shifting at least one of the first input signal or the second input signal if the first input signal is determined to be out-of-phase with the second input signal.

According to certain aspects, the operations 700 may further include providing information in addition to a determination whether the first input signal is in-phase or out-of-phase with the second input signal. For example, the information may indicate a degree to which the first and second input signals are phase shifted The various operations or methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering.

For example, means for transmitting may comprise a transmitter (e.g., the transceiver front-end 254 of the user terminal 120 depicted in FIG. 2 or the transceiver front-end 222 of the access point 110 shown in FIG. 2) and/or an antenna (e.g., the antennas 252ma through 252mu of the user terminal 120m portrayed in FIG. 2 or the antennas 224a through 224ap of the access point 110 illustrated in FIG. 2). Means for receiving may comprise a receiver (e.g., the transceiver front-end 254 of the user terminal 120 depicted in FIG. 2 or the transceiver front-end 222 of the access point 110 shown in FIG. 2) and/or an antenna (e.g., the antennas 252ma through 252mu of the user terminal 120m portrayed in FIG. 2 or the antennas 224a through 224ap of the access point 110 illustrated in FIG. 2). Means for processing or means for determining may comprise a processing system, which may include one or more processors, such as the RX data processor 270, the TX data processor 288, and/or the controller 280 of the user terminal 120 illustrated in FIG. 2. Means for mixing may include a mixing circuit, such as the mixer 402 in FIG. 4. Means for frequency dividing may include a frequency dividing circuit, such as the Div2 frequency dividers 506 in FIG. 5A and/or FIG. 5B. Means for filtering may include any suitable filtering circuit including active and/or passive filters, such as the capacitor 404 in FIG. 4. Means for comparing may include a comparing circuit, such as an ADC or the comparator 406 in FIG. 4. Means for phase shifting may include a phase shifting circuit, such as a multiplexer configured to select between pass-through and polarity flipped output signals. Means for regenerating may include a repeating circuit, such as the LO repeater 510 in FIG. 5A and/or FIG. 5B.

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

As used herein, a phrase referring to "at least one of" a list of items refers to any combination of those items, including single members. As an example, "at least one of: a, b, or c" is intended to cover: a, b, c, a-b, a-c, b-c, and a-b-c.

The various illustrative logical blocks, modules and circuits described in connection with the present invention may be implemented or performed with a general purpose processor, a digital signal processor (DSP), an application specific integrated circuit (ASIC), a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the PHY layer. In the case of a user terminal 120 (see FIG. 1), a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further.

The processing system may be configured as a general-purpose processing system with one or more microprocessors providing the processor functionality and external memory providing at least a portion of the machine-readable media, all linked together with other supporting circuitry through an external bus architecture. Alternatively, the processing system may be implemented with an ASIC (Application Specific Integrated Circuit) with the processor, the bus interface, the user interface in the case of an access terminal), supporting circuitry, and at least a portion of the machine-readable media integrated into a single chip, or with one or more FPGAs (Field Programmable Gate Arrays), PLDs (Programmable Logic Devices), controllers, state machines, gated logic, discrete hardware components, or any other suitable circuitry, or any combination of circuits that can perform the various functionality described throughout this disclosure. Those skilled in the art will recognize how best to implement the described functionality for the processing system depending on the particular application and the overall design constraints imposed on the overall system.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A circuit for phase detection, comprising:
   a mixer configured to mix a first input signal having a first frequency with a second input signal having a second frequency to produce an output signal having frequency components at the sum of and the difference between the first frequency and the second frequency, wherein the first frequency is the same as the second frequency;
   a filter connected with the mixer and configured to remove one of the frequency components at the sum of the first frequency and the second frequency, thereby leaving a direct current (DC) component; and
   an analog-to-digital converter (ADC) connected with the filter and configured to determine whether the first input signal is in-phase or out-of-phase with the second input signal based on a comparison between the DC component and a reference signal.

2. The circuit of claim 1, wherein the first, second, and output signals are differential signals.

3. The circuit of claim 2, wherein the filter comprises a capacitor to shunt a first output signal and a second output signal of a differential pair for the output signal to generate a first DC component and a second DC component, respectively.

4. The circuit of claim 3, wherein:
   the ADC is a comparator configured to compare the first output signal to the second output signal, the second output signal being the reference signal;
   the comparator is configured to output a logic HIGH to indicate that the first input signal is in-phase with the second input signal if the first DC component has a greater amplitude than the second DC component; and
   the comparator is configured to output a logic LOW to indicate that the first input signal is out-of-phase with the second input signal if the second DC component has a greater amplitude than the first DC component.

5. The circuit of claim 1, wherein:
   a first expected phase shift range corresponding to the first input signal being in-phase with the second input signal leads to an amplitude of the DC component being above a first threshold for the ADC; and
   a second expected phase shift range corresponding to the first input signal being out-of-phase with the second input signal leads to the amplitude of the DC component being below a second threshold for the ADC.

6. The circuit of claim 1, wherein the mixer comprises a Gilbert cell.

7. The circuit of claim 1, wherein the ADC comprises a clocked regenerative comparator.

8. The circuit of claim 1, wherein the ADC is a multi-bit ADC configured to provide information in addition to a determination whether the first input signal is in-phase or out-of-phase with the second input signal.

9. The circuit of claim 8, wherein the information indicates a degree to which the first and second input signals are phase shifted.

10. A circuit for wireless communications, comprising:
a first transceiver path having a first local oscillating signal with a first frequency;
a second transceiver path having a second local oscillating signal with a second frequency, wherein the first frequency is the same as the second frequency; and
a first phase detector connected with the first transceiver path and the second transceiver path, wherein the first phase detector comprises:
a first mixer configured to mix the first local oscillating signal with the second local oscillating signal to produce a first output signal having frequency components at the sum of and the difference between the first frequency and the second frequency;
a first filter connected with the first mixer and configured to remove one of the frequency components at the sum of the first frequency and the second frequency, thereby leaving a first direct current (DC) component; and
a first analog-to-digital converter (ADC) connected with the first filter and configured to determine whether the first local oscillating signal is in-phase or out-of-phase with the second local oscillating signal based on a comparison between the first DC component and a first reference signal.

11. The circuit of claim 10, wherein:
the first transceiver path comprises a first frequency divider configured to divide a frequency of a voltage-controlled oscillator (VCO) signal to produce the first local oscillating signal; and
the second transceiver path comprises a second frequency divider configured to divide the frequency of the VCO signal to produce the second local oscillating signal.

12. The circuit of claim 11, further comprising a repeater configured to regenerate the VCO signal, wherein the second frequency divider is configured to produce the second local oscillating signal from the regenerated VCO signal.

13. The circuit of claim 10, further comprising a phase shifter configured to phase shift the first local oscillating signal or the second local oscillating signal if the first ADC determines that the first local oscillating signal is out-of-phase with the second local oscillating signal.

14. The circuit of claim 10, further comprising:
a third transceiver path having a third local oscillating signal with a third frequency, wherein the first frequency is the same as the third frequency; and
a second phase detector connected with the second transceiver path and the third transceiver path, wherein the second phase detector comprises:
a second mixer configured to mix the second local oscillating signal with the third local oscillating signal to produce a second output signal having frequency components at the sum of and the difference between the second frequency and the third frequency;
a second filter configured to:
receive the second output signal produced by the second mixer; and
remove one of the frequency components at the sum of the second frequency and the third frequency, thereby leaving a second DC component; and
a second ADC configured to:
receive the second DC component from the second filter; and
determine whether the second local oscillating signal is in-phase or out-of-phase with the third local oscillating signal based on a comparison between the second DC component and a second reference signal.

15. The circuit of claim 14, wherein:
the first transceiver path comprises a first frequency divider configured to divide a frequency of a voltage-controlled oscillator (VCO) signal to produce the first local oscillating signal;
the second transceiver path comprises a second frequency divider configured to divide the frequency of the VCO signal to produce the second local oscillating signal; and
the third transceiver path comprises a third frequency divider configured to divide the frequency of the VCO signal to produce the third local oscillating signal.

16. The circuit of claim 10, wherein the first local oscillating signal, the second local oscillating signal, and the first output signal are differential signals.

17. The circuit of claim 16, wherein the first filter comprises a capacitor configured to shunt signals of a differential pair for the first output signal to generate the first DC component and a second DC component, respectively.

18. The circuit of claim 17, wherein:
the first ADC is a comparator configured to compare the signals of the differential pair for the first output signal;
the comparator is configured to output a logic HIGH to indicate that the first local oscillating signal is in-phase with the second local oscillating signal if the first DC component has a greater amplitude than the second DC component; and
the comparator is configured to output a logic LOW to indicate that the first local oscillating signal is out-of-phase with the second local oscillating signal if the second DC component has a greater amplitude than the first DC component.

19. The circuit of claim 10, wherein the first mixer comprises a Gilbert cell mixer.

20. The circuit of claim 10, wherein the first ADC comprises a clocked regenerative comparator.

21. The circuit of claim 10, wherein:
the first ADC comprises a multi-bit ADC configured to provide information in addition to a determination whether the first local oscillating signal is in-phase or out-of-phase with the second local oscillating signal; and
the information indicates a degree to which the first and second local oscillating signals are phase shifted.

22. A method for detecting phase shift between signals, comprising:
mixing a first input signal having a first frequency with a second input signal having a second frequency to produce an output signal having frequency components at the sum of and the difference between the first frequency and the second frequency, wherein the first frequency is the same as the second frequency;
filtering the output signal to remove one of the frequency components at the sum of the first frequency and the second frequency, thereby leaving a direct current (DC) component;
comparing the DC component to a reference signal; and
determining whether the first input signal is in-phase or out-of-phase with the second input signal based on the comparison.

23. The method of claim 22, wherein the first, second, and output signals are differential signals.

24. The method of claim 23, wherein the filtering comprises using a capacitor to shunt a first output signal and a second output signal of a differential pair for the output signal to generate a first DC component and a second DC component, respectively.

25. The method of claim 24, wherein:
the comparing comprises comparing the first output signal to the second output signal, the second output signal being the reference signal;
the first input signal is determined to be in-phase with the second input signal if the first DC component has a greater amplitude than the second DC component; and
the first input signal is determined to be out-of-phase with the second input signal if the second DC component has a greater amplitude than the first DC component.

26. The method of claim 22, wherein:
a first expected phase shift range corresponding to the first input signal being in-phase with the second input signal leads to an amplitude of the DC component being above a first threshold; and
a second expected phase shift range corresponding to the first input signal being out-of-phase with the second input signal leads to the amplitude of the DC component being below a second threshold.

27. The method of claim 22, wherein the mixing comprises using a Gilbert cell to mix the first input signal with the second input signal.

28. The method of claim 22, wherein:
the first input signal is a first local oscillating signal of a first transceiver path; and
the second input signal is a second local oscillating signal of a second transceiver path adjacent to the first transceiver path.

29. The method of claim 28, further comprising:
frequency dividing a voltage-controlled oscillator (VCO) signal to generate the first local oscillating signal;
regenerating the VCO signal to generate a repeated oscillating signal; and
frequency dividing the repeated oscillating signal to generate the second local oscillating signal.

30. The method of claim 22, further comprising phase shifting the first input signal or the second input signal if the first input signal is determined to be out-of-phase with the second input signal.

* * * * *